United States Patent

Näher et al.

[11] Patent Number: 6,020,050
[45] Date of Patent: Feb. 1, 2000

[54] SEMICONDUCTOR CHIP

[75] Inventors: Ulrich Näher; Adrian Berthold; Thomas Scheiter; Christofer Hierold, all of München, Germany

[73] Assignee: Siemens Aktiengesellschaft, Munich, Germany

[21] Appl. No.: 08/930,947

[22] PCT Filed: Apr. 1, 1996

[86] PCT No.: PCT/DE96/00575

§ 371 Date: Oct. 10, 1997

§ 102(e) Date: Oct. 10, 1997

[87] PCT Pub. No.: WO96/32627

PCT Pub. Date: Oct. 17, 1996

[30] Foreign Application Priority Data

Apr. 12, 1995 [DE] Germany ............... 195 13 921

[51] Int. Cl.[7] ............... B32B 3/00; H01L 23/12
[52] U.S. Cl. ............... 428/210; 428/209; 257/709; 257/711; 174/74 R
[58] Field of Search ............... 428/210, 209; 257/708, 709, 711, 415; 174/74 R

[56] References Cited

U.S. PATENT DOCUMENTS

| 4,256,382 | 3/1981 | Piliavin et al. ............... 350/334 |
| 5,760,455 | 6/1998 | Hierold et al. ............... 257/415 |

FOREIGN PATENT DOCUMENTS

| 0 306 178 | 3/1989 | European Pat. Off. . |
| 0 506 491 | 9/1992 | European Pat. Off. . |

*Primary Examiner*—Deborah Jones
*Assistant Examiner*—Cathy F. Lam
*Attorney, Agent, or Firm*—Hill & Simpson

[57] ABSTRACT

A semiconductor chip has a membrane mounted on supports that are held in the material of the chip so that the membrane is supported at a space from the chip. The membrane may be a metal layer. The supports are columns or webs that extend into the chip material. Electrical connections to the membrane may be made by conductive supports.

16 Claims, 1 Drawing Sheet

SEMICONDUCTOR CHIP

BACKGROUND OF THE INVENTION

1. Field of the Invention

The present invention is directed to a semiconductor chip with a membrane resting on metallic supports.

2. Description of the Related Art

Particularly in the manufacture of sensors and actuators, it is often required in semiconductor technology to produce a layer-like structure free above a substrate. Such a structure can be utilized, for example, as a membrane for pressure sensors, as a closure layer of a cavity or as an upper cooperating electrode for capacitative sensors or actuators. A thin aluminum layer, for example, as applied in the course of a CMOS process as a metallization level can be employed for such a membrane. Such a metal layer yields an electrically conductive membrane that, after the removal of the material situated thereunder, can serve, for example, as a cooperating electrode or as a pressure membrane for capacitative measurement. As a result of the mechanical stability, such a metal layer can also be advantageously employed when a cavity, in which a micromechanical elements moves, is to be covered toward the outside, such as, for example, given the component disclosed in German Patent Application P 19509868. A high, thermally caused tensile stress that deteriorates the mechanical stability of a membrane layer that is not supported surface-wide usually occurs in the metallization.

SUMMARY OF THE INVENTION

An object of the present invention is to provide a semiconductor chip, whereby a membrane-like structure is realized with adequate mechanical stability.

This and other objects and advantages are achieved with the semiconductor chip having a membrane resting on supports, the membrane having a surface at the side provided with the supports, the surface being free of solid material other than the supports. The supports each have an end opposite the membrane, the end being anchored in a respective opening in a solid material. The openings have an outside edge that corresponds to the lateral dimensions of the support.

Further developments provide that the membrane is a metal layer. The membrane may include recesses, holes or windows in it.

In a preferred embodiment, the supports have a part anchored in the solid material, the part having a laterally limiting outside surface in the plane defined by the membrane and at least one section extending perpendicular to the plane of the membrane. The support part anchored in the solid material is a cuboid in one embodiment, while in another it is cylindrically shaped.

An example of the membrane according to the invention is rectangular in shape and the supports are in the form of two webs at the edges of the membrane opposite one another. The supports may be anchored in the solid material to a depth of 0.5 to 5 µm, and preferably to a depth of 1.5 µm. The solid material in which the supports are anchored is preferably semiconductor material.

The underlying idea of the invention is comprised in securing the membrane layer on pillar-like or web-like supports and anchoring these supports in solid material to a certain depth such that the supports are firmly held on the foundation even given the occurrence of distortions in the membrane layer. The supports that hold the membrane at a spacing from the substrate are located between the membrane and a substrate, which is a semiconductor structure or the like, so that a free surface of the membrane layer can be present at that side of the membrane facing toward the substrate or the semiconductor layer structure. This free surface can be formed, for example, by a cavity produced between the substrate and the membrane. It is also possible that the membrane layer is carried only by supports which extend entirely outside of the remaining semiconductor material. In this case, the membrane is completely free of further solid material, at least at the side of the membrane facing toward the substrate. It is critical that the pillar-like or web-like supports carrying the membrane layer have their ends lying opposite the membrane anchored up to a certain depth in the solid material of the substrate or in the layer structure situated thereon. It is advantageous therefor when the supports comprise lateral limiting surfaces at these ends that proceed at least partially perpendicular to the plane of the membrane layer. The support can be especially firmly anchored in the solid material with such a perpendicularly limited part. Given cylindrical supports, that end of the supports lying opposite the membrane can, for example, extend a few µm into the semiconductor material.

BRIEF DESCRIPTION OF THE DRAWINGS

A more detailed description of the invention follows with reference to FIGS. 1 through 4.

DETAILED DESCRIPTION OF THE PREFERRED EMBODIMENTS

Figure 1:
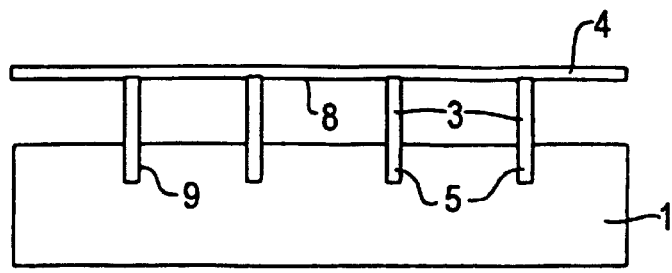
FIG. 1 shows an inventive semiconductor chip in schematic crossection.

FIG. 1 shows a substrate 1 that, for the sake of simplicity, is drawn structureless but that, in various embodiments, can be a substrate, a semiconductor layer structure or the upper portion of a substrate on which semiconductor layers are grown or that is provided with dielectric or metallic layers. The layer referred to below as a membrane 4, which can exhibit different thicknesses, be fashioned as a membrane, a protective layer, a cooperating electrode or the like and that can be of various materials such as, for example, metal, semiconductor material or dielectric, is located at a spacing from this substrate 1 and is held at this spacing by the supports 3. In this example, a cavity is situated between the substrate 1 and the membrane 4. In this example, thus, the surface 8 of the membrane layer 4 facing toward the substrate 1 is completely free, except for the locations at which the supports 3 engage. These supports 3, which can, for example, be evibodied as cylindrical columns have their ends 5 facing away from the membrane 5 anchored in the material of the substrate 1.

In this example, approximately cylindrical openings that can typically have a diameter of, for example, approximately 1 µm and a depth between, for example, 0.5 µm and 5 µm are etched out in the substrate 1 and filled with the material of which will form the supports. The supports 3, for example, are of metal or polysilicon. It is advantageous when the anchored ends 5 of the supports 3—as viewed in the alignment of the plane established by the membrane 4—comprise lateral edging surfaces 9 that proceed essentially perpendicularly to the plane of the membrane 4. A distance that proceeds perpendicular to the plane of the membrane should thus at least lie in the edging surfaces 9. That end of the cylindrical supports (in this example) lying opposite the membrane can, for example, be cylindrical. Web-shaped supports that approximately correspond to a vertical layer can have cuboid portions anchored in the solid material of the substrate 1. It is also fundamentally possible when cylindrical supports having, for example, an approximately hemispherical termination of the end anchored in the substrate are provided and only this hemispherical termination is anchored in the solid material. Measured perpendicular to the membrane, the dimension of the ends 5 of the supports anchored in the substrate 1 is dependent on the intended mechanical stressing of the supports.

Figure 2:
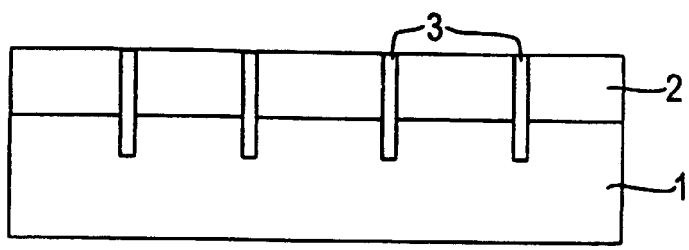
FIGS. 2 and 3 show intermediate products of the semiconductor chip after various stages of the manufacture in crossection.
Figure 3:
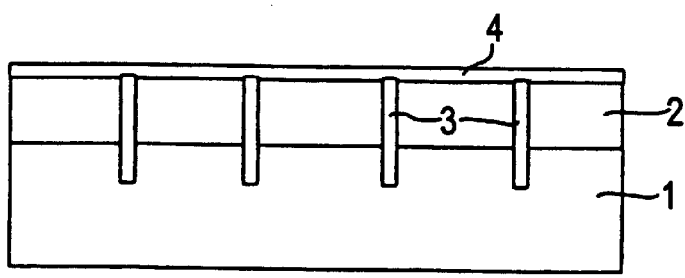

The manufacture of this structure ensues, for example, in that an auxiliary layer 2 is applied onto the substrate 1 surface-wide according to FIG. 2. This auxiliary layer 2 is manufactured of a material that can be removed selectively relative to the material of the substrate 1 and to the material provided for the supports and for the membrane layer. Given a silicon substrate, this auxiliary layer 2 can, for example, be silicon oxide or some other dielectric. The regions provided for the supports are etched out in this layer, for example with a dry etching process. For example, these etched openings can be manufactured in the form of via holes, like those also etched for the terminal contacts in the course of a CMOS process. Differing from traditional via hole etching, the openings provided for the supports are etched down into the material of the substrate 1 or of the layer structure. The depth of this etching under the auxiliary layer 2 is advantageously selected, for example, between 0.5 $\mu$m and about 5 $\mu$m. The depth of this etching is not limited by the present invention; however, an etching into the substrate deeper than about 5 $\mu$m does not significantly improve the stability of the supports to be produced. A depth of the anchoring of the supports of at least 1.5 $\mu$m is advantageous when greater mechanical stability is required.

The etched holes are then filled with the material provided for the supports 3. A filling of via holes as a known from the CMOS process can be employed therefor. For example, a Ti/TiN barrier is first produced that serves as an adhesion layer and is intended to prevent the metal of the supports from alloying with the semiconductor material, i.e., for example, to prevent the metal from diffusing into the semiconductor material. Subsequently, the holes are filled with the metal of the supports, for example tungsten. As needed, this metal is etched back to such an extent that, as shown in FIG. 2, is terminates flush with the upper side of the auxiliary layer 2. The layer provided for the membrane 4 is then deposited surface-wide on the substrate and potentially structured. For example, it can thereby be a matter of the first metallization level that, for example, can be aluminum or tungsten. In order to be able to remove the material of the auxiliary layer 2, etching holes are bored into the membrane 4, these being numerous and, for example, having a diameter of about 1 $\mu$m. The auxiliary layer 2 is removed through these etching holes in a predominantly isotropic etching step, whereby an etchant that contains, for example, hydrogen fluoride (HF, hydrofluoric acid) can be employed in case of an oxide layer. The structure shown in FIG. 1 thus derives.

In this way, it is possible to firmly anchor the membrane 4 in the solid material of the substrate 1 with supports 3. Even when they are entirely or nearly completely etched free, the anchored structures can no longer be detached from the substrate even as a result of strong mechanical stressing.

An electrical connection of a conductively manufactured membrane 4 can ensue with electrically conductive supports 3. When such a conductive contact between the support and a region of the substrate 1 is desired, the barrier provided between the support and the substrate can, for example, be sputtered in a collimated fashion (for example, given use of titanium for the supports) or can be deposited in a CVD (chemical vapor deposition) process (for example, given use of TiN for the substrates). It is adequate for good mechanical adhesion of the supports in the solid material of the substrate when the etching hole in the auxiliary layer 2 is filled with metal without prior manufacture of a barrier layer. An electrical insulation from the surrounding semiconductor material can, for example, be achieved with a pn-junction in the region of the ends 5 of the supports 3. The solid material in which the supports 3 are anchored can fundamentally be arbitrary when adequate adhesion and mechanical stability are present. In addition to semiconductor material such as, for example, crystalline silicon or polysilicon, a dielectric layer of, for example, silicon nitride also comes into consideration as an upper layer of a layer structure 1. It is not necessary to provide the membrane layer with etching holes when the auxiliary layer 2 can, for example, be removed from the side via lateral etching channels. There is also the possibility of closing etching holes in the membrane with a subsequently deposited layer of, for example, oxide or nitride. One thus obtains a membrane with high mechanical stability that is supported at only a few points and when closed air tight, for example, is suitable for use in a pressure sensor.

In the inventive semiconductor chip, the membrane can be supported by pillar-like supports at regular intervals, as shown in FIG. 1. The supports in FIG. 1 can also be a matter of supports proceeding web-like that have the crossectional shape shown in FIG. 1. Dependent on the number and dimension of the supports, the membrane 4 can be supported so as to be stable to a greater or lesser extent. Given employment of this layer as an upper cooperating electrode or as an encapsulation of a movable attached micro-mechanical function element, the supports will preferably be attached at the edges of the membrane. This is also advantageous given employment of the device as a membrane of a pressure sensor, so that the membrane 4 is only laterally supported and is deformable in the middle according to the pressure changes to be measured.

Figure 4:
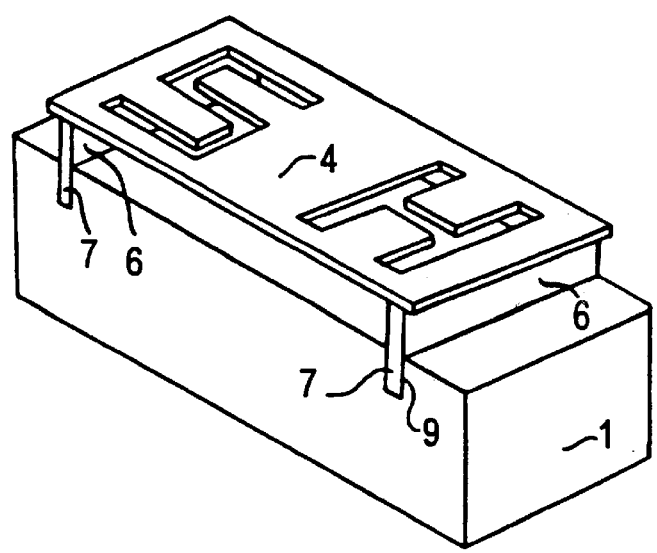
FIG. 4 shows another embodiment of an inventive chip in an oblique plan view.

FIG. 4 shows an alternative embodiment of the chip wherein the membrane 4 is rectangular and supported only along the two narrow sides by supports 6 fashioned which are web-like. The portions 7 of these supports 6 anchored in the substrate 1 are cuboid here and are limited by outside surfaces 9 that are rectangular and reside perpendicular to the plane of the membrane 4. The S-shaped and H-shaped recesses shown in the illustrated example are present in order to relieve the tensile forces occurring in the membrane 4. In this way, it is also possible to secure a relatively thick membrane 4 in a stable fashion on a few thin supports. When many supports are provided, the mechanical stability can be increased such that the membrane 4 can be employed, for example, as a cover layer for sensitive structures on the chip. During further processing or assembly, the chip can then be exposed to high mechanical loads because the cover layer is anchored on the substrate with adequate stability.

Although other modifications and changes may be suggested by those skilled in the art, it is the intention of the inventors to embody within the patent warranted hereon all changes and modifications as reasonably and properly come within the scope of their contribution to the art.

We claim:

1. A semiconductor chip, comprising:

a chip of solid material;

supports mounted in said chip, said supports being of metal;

a membrane resting on said supports, said membrane having a surface free of said solid material at a side provided with said supports, said membrane being of metal, and said supports have an end facing away from said membrane anchored in a respective opening in said solid material, and said openings having an outside edge that corresponds to lateral dimensions of the respective support; said supports being anchored in said solid material to a depth of between 0.5 µm and 5 µm.

2. A semiconductor chip according to claim 1, wherein said membrane defines recesses.

3. A semiconductor chip according to claim 1, wherein said supports have a part anchored in said solid material, said part includes an edge in a plane defined by said membrane, said part includes at least one section adjacent said edge that proceeds perpendicular to the plane of said membrane, and wherein said part of said support anchored in solid material is cuboid.

4. A semiconductor chip according to claim 1, wherein said supports have a part anchored in said solid material, said part includes an edge in a plane defined by said membrane, said part includes at least one section adjacent said edge that proceeds perpendicular to the plane of said membrane, and wherein said part of said support anchored in solid material is cylindrically shaped.

5. A semiconductor chip according to claim 1, wherein said membrane is rectangular and said supports are two webs arranged at edges of said membrane lying opposite one another and along said edges.

6. A semiconductor chip according to claim 1, wherein said solid material in which said supports are anchored is semiconductor material.

7. A semiconductor chip according to claim 1, wherein said membrane defines holes.

8. A semiconductor chip according to claim 1, wherein said membrane defines windows.

9. A semiconductor chip, comprising:

a chip of solid material;

supports mounted in said chip, said supports being of metal;

a membrane resting on said supports, said membrane having a surface free of said solid material at a side provided with said supports, said membrane being of metal, and said supports have an end facing away from said membrane anchored in a respective opening in said solid material, and said openings having an outside edge that corresponds to lateral dimensions of the respective support; said supports being anchored in said solid material to a depth of at least 1.5 µm.

10. A semiconductor chip according to claim 9, wherein said membrane defines recesses.

11. A semiconductor chip according to claim 9, wherein said supports have a part anchored in said solid material, said part includes an edge in a plane defined by said membrane, said part includes at least one section adjacent said edge that proceeds perpendicular to the plane of said membrane, and wherein said part of said support anchored in solid material is cuboid.

12. A semiconductor chip according to claim 9, wherein said supports have a part anchored in said solid material, said part includes an edge in a plane defined by said membrane, said part includes at least one section adjacent said edge that proceeds perpendicular to the plane of said membrane, and wherein said part of said support anchored in solid material is cylindrically shaped.

13. A semiconductor chip according to claim 9, wherein said membrane is rectangular and said supports are two webs arranged at edges of said membrane lying opposite one another and along said edges.

14. A semiconductor chip according to claim 9, wherein said solid material in which said supports are anchored is semiconductor material.

15. A semiconductor chip according to claim 9, wherein said membrane defines holes.

16. A semiconductor chip according to claim 9, wherein said membrane defines windows.

* * * * *